United States Patent [19]
Smith, III et al.

[11] Patent Number: 6,141,632
[45] Date of Patent: *Oct. 31, 2000

[54] METHOD FOR USE IN SIMULATION OF AN SOI DEVICE

[75] Inventors: George E. Smith, III, Wappingers Falls; Fariborz Assaderaghi, Mahopac; Paul D. Muench, Poughkeepsie; Lawrence F. Wagner, Jr., Fishkill; Timothy L. Walters, Poughkeepsie, all of N.Y.

[73] Assignee: International Business Machines Corporation, Armonk, N.Y.

[*] Notice: This patent is subject to a terminal disclaimer.

[21] Appl. No.: 09/388,594

[22] Filed: Sep. 2, 1999

Related U.S. Application Data

[63] Continuation-in-part of application No. 08/938,676, Sep. 26, 1997, Pat. No. 6,023,577.

[51] Int. Cl.[7] ................................................. G06G 7/48
[52] U.S. Cl. ................................... 703/14; 703/20; 703/4
[58] Field of Search ........................... 703/20, 2, 4, 14, 703/22; 716/1, 4

[56] References Cited

U.S. PATENT DOCUMENTS

| | | |
|---|---|---|
| 5,384,720 | 1/1995 | Ku et al. . |
| 5,396,615 | 3/1995 | Tani . |
| 5,424,964 | 6/1995 | Machala, III et al. ................. 364/578 |
| 5,446,676 | 8/1995 | Huang et al. ........................... 364/578 |
| 5,553,008 | 9/1996 | Huang et al. ........................... 364/578 |
| 5,600,578 | 2/1997 | Fang et al. ............................... 364/578 |
| 5,606,518 | 2/1997 | Fang et al. ............................... 364/578 |
| 5,617,325 | 4/1997 | Schaefer ................................. 364/488 |
| 5,774,367 | 6/1998 | Reyes et al. ............................ 364/488 |
| 5,796,624 | 8/1998 | Sridar et al. ............................ 364/489 |
| 6,023,577 | 6/1998 | Smith, III et al. .................. 395/500.35 |

*Primary Examiner*—Mark H. Rinehart
*Attorney, Agent, or Firm*—Lynn L. Augspurger

[57] ABSTRACT

A method for use in electronic design models encoded into design software for use in SOI based FET logic design includes simulation of an SOI device by and setting a floating body voltage to any desired value at any time during the simulation, by adding to the model an ideal voltage source, whose value is a desired body voltage, in series with an ideal current source, whose value is a constant times the voltage across itself. When the constant is zero, no current can flow, and any additional components have no effect on the circuit. When the constant is non-zero, said ideal current source appears to be the same as a resistor such that current can flow in to or out from the body node, setting its voltage. The constant is kept zero at all times, except when it is desired to change the body voltage. The body voltage can be reset at any time to solve the problem of successive delays in one simulation run and resetting the voltage before each delay measurement starts. To solve the problem of predicting the delay in a delay predictor (for example, delay rules generation), the offset from the body voltage as a part of the best case/worst case determination is included. The improved process employs a topological analysis for circuit elements to determine whether the element falls in one of several categories, and in the process determines which elements of a circuit might be in AC equilibrium.

18 Claims, 2 Drawing Sheets

INPN　　PARASITIC LATERAL NPN TRANSISTOR COLLECTOR CURRRENT
IBS, IBD　INTERNAL BASE-EMITTER AND BASE-COLLECTOR DIODES FOR NPN
ISB, IDB　IMPACT IONIZATION CURRENT WHICH CHARGES FLOATING BODY
CSB, CDB　THESE CAPACITORS INCLUDE EXTRA DIFFUSION CAPACITANCE
CSX, CBX, CDX　CAPACITANCE TO BACK OXIDE
B　　　　INTERNAL FLOATING BODY NODE

METHOD FOR USE IN SIMULATION OF AN SOI DEVICE

RELATED APPLICATIONS

This application is an improvement and continuation in part of and claims priority of U.S. Ser. No. 08/938,676, Filed Sep. 26, 1997, now U.S. Pat. No. 6,023,577, Issued Feb. 8, 2000, entitled Method for use in Simulation of an SOI Device, by George E. Smith, III, et al.

Other related co-pending applications of George E. Smith, III, the inventor herein, with others currently pending include, U.S. Ser. No. 09/294,045 filed Apr. 19, 1999, for an Improved Method for Statically Timing SOI Devices and Circuits; U.S. Ser. No. 09/294,163 filed Apr. 19, 1999 for an Improved Method for Statically Timing SOI Devices and Circuits; and U.S. Ser. No. 09,294,178 filed Apr. 19, 1999 for an Improved Method for Statically Timing SOI Devices and Circuits.

These co-pending applications and the present application are owned by one and the same assignee, International Business Machines Corporation of Armonk, N.Y.

The descriptions set forth in these co-pending applications are hereby incorporated into the present application by this reference.

Trademarks: S/390 and IBM are registered trademarks of International Business Machines Corporation, Armonk, N.Y., U.S.A.. Other names may be registered trademarks or product names of International Business Machines Corporation or other companies.

FIELD OF THE INVENTION

This invention is related to silicon on insulator integrated circuits, and particularly to a method for accounting for SOI FET floating body voltages in delay calculations used in the creation of the circuit design.

BACKGROUND OF THE INVENTION

As background for the method which will be described, simulations have been used in the creation of silicon devices, including thin film devices made by a process known as silicon-on-insulator (also called SOI) to make SOI devices. SOI device performance depends on the current voltage on the floating body of the device (including circuits). This body voltage depends, in turn, on the switching history of the device (or circuit). Simulations used in the creation of silicon devices (including circuits) include conventional delay measurement processes, but until the development of the techniques referenced in the related applications, there was no known simulation techniques which have a way to account for the effect of current body voltage. Prior methods of accounting for the history effect of the current body voltage required either simulating the exact history in question, or trying to bound the problem. Neither method is applicable to delay rules. Neither method allows correction for ordering of simulations within one run. Theoretically, accounting for the effect of current body voltage would be possible by simulating the entire switching history, but this is not practical and so conventional delay estimation processes do not have a way to account for this effect at all. Furthermore, as the usual procedure was to measure delays for several different loads in one simulation run, the use of a simulation history would not be acceptable. This dependence on the history of the simulation will give different, unpredictable results depending on the order of the simulation runs.

We have concluded that there is needed a way to simulate the effect in a way that can be used in a system used for simulating electrical delay such as those illustrated by Mitsubishi Denki K. K.'s U.S. Pat. No. 5,396,615 and Hitachi Micro Systems Inc.'s U.S. Pat. No. 5,384,720, as general examples of electrical simulation and design systems and yet to date this has not been achieved by others.

We would note that there are numerous publications and patents, which could be used to illustrate what others do with SOI devices, and what simulation techniques have been used. Among those are those referenced in this patent disclosure, and prior applications, including an unpublished report at International Business Machines Corporation in January, 1993 Messrs. Dubois,(E.); Shahidi, (G. G.) and Sun,(J. Y. C.) printed their "Analysis of the Speed Performance of Thin Film CMOS/SOI Ring Oscillators" in which they noted, after analyzing the performance advantage of thin-film SOI/CMOS ring oscillators over their bulk silicon counterparts using compact analytic modeling for circuit simulation, that most of the speed improvement of SOI over bulk at the time could be explained in terms of reduced threshold voltage, body doping factor and junction capacitance's. Their tabulated model based on DC current measurements of individual devices was also utilized to achieve higher accuracy. A residual discrepancy between simulated and measured propagation delays was found in both approaches. A comparison of the integrated currents and stored charges in the ring oscillators identified the source of this discrepancy in the underestimation of the charging/discharging currents. These researchers determined that transient enhancement of the current was not the source of this discrepancy by an analysis of the supply voltage dependence of the propagation delay. The sensitivity of the DC current characteristics of SOI devices to the ground rules was discussed and found by them to explain systematically poor predictions of the delay per stage by means of circuit simulation. This report was internal to IBM but it shows no way to simulate the effect of current body voltage in SOI device design, and illustrates the dismay of researches as to the poor prediction of delay by circuit simulation in this area.

We concluded that there was needed a way to simulate the effect of current body voltage in SOI circuit device design is needed out yet to date this has not been achieved by others. In efforts at IBM described in the prior applications, partially depleted SOI devices maintain a stored charge in the body of the device. This charge gives rise to the "body voltage". The body voltage, in turn, can influence the threshold voltage (VT) of the device and hence the performance of the circuit.

In the past, with bulk silicon devices, this effect was unimportant. The first referenced related application, U.S. Ser. No. 08/938,676, Filed Sep. 26, 1997, now U.S. Pat. No. 6,023,577, Issued Feb. 8, 2000, described a method where the body voltage can be set randomly, or be set to track process variations. The actual measured body voltage is not completely random. The method shown in the other related disclosures shows methods for trying to get a more accurate representation of the effect of the body voltage.

It is desirable to improve upon these prior breakthroughs, and we will describe a more specialized method to get an estimate of the body voltage. While the method is not as general as in the parent application, it is more accurate where it can be used.

SUMMARY OF THE INVENTION

As will be described, we have developed a method to set the floating body voltage to any desired value for use at any time in and during a simulation. The method of analyzing circuits shown in the prior application chose a voltage for the SOI transistor body that bounded all possible voltages. The method in the other referenced applications narrowed the possibilities somewhat. Here, we analyze what part of a circuit might be in AC equilibrium, and apply special processing to that section. We also consider the case where different parts of the circuit being analyzed have different histories, and we can now recognize that assuming that all transistors have "slow" or "fast" histories is not sufficient.

Again, the improvements which result from use of the method allows a designer to easily build delay rules that work with their current design methodology by analyzing what part of a circuit might be in AC equilibrium. The designer can have multiple delay simulations within one run, and get the same answer regardless of ordering. As a result of our method there are now known limits on the performance, and designers don't have to keep trying different combinations of inputs and history to find a best or worst case value. These and other improvements are set forth in the following detailed description. For a better understanding of the invention with advantages and features, refer to the drawings and the detailed description below:

DRAWINGS

DETAILED DESCRIPTION OF THE INVENTION

Figure 1:
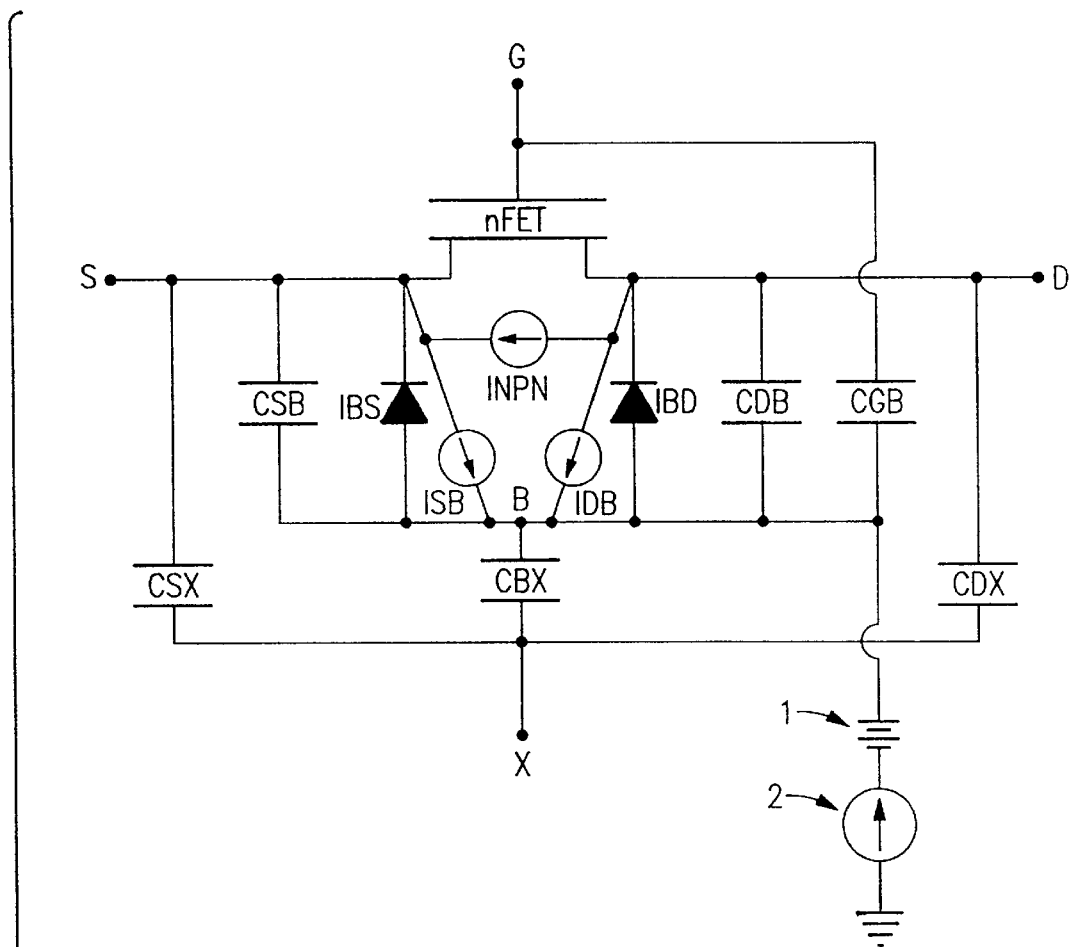
FIG. 1 illustrates in what we mean by a floating body and the current body voltage is the current body voltage at point B (the internal floating body node) which is the body.

In accordance with the invention we have developed with respect to FIG. 1 a method for use in a model for simulation of an SOI device, generally comprises the steps of: setting the floating body voltage to any desired value at any time during the simulation, by adding to the model an ideal voltage source, whose value is a desired body voltage, in series with an ideal current source, whose value is a constant (call it GJ) times the voltage across itself. As we have stated, FIG. 1 illustrates an what we mean by a floating body and the current body voltage is the current body voltage at point B which is the body. This FIGURE is applicable to either an NFET or PFET. In this FIG. 1, the elements shown are described by the labels at the bottom of the FIG. 1. In this FIG. 1 the numeral "1" identifies an ideal voltage source and "2" identifies an ideal current source.

When the constant GJ is zero, no current can flow, and the additional components have no effect on the circuit. When the constant GJ is non-zero, the ideal current source appears to be the same as a resistor. Thus current can flow in to or out from the body node, setting its voltage.

The constant GJ is kept zero at all times, except when it is desired to change the body voltage.

Two steps are involved in selecting a value for the ideal voltage source, which will set the desired floating body voltage. First, a static body voltage can be computed solely by considering the terminal voltages of the device and the temperature. This voltage is the voltage the body will naturally settle at after a long time with no switching activity.

From that base static voltage, limits on the changes to this voltage can be found based on the different types of switching activity possible. For example, increasing the gate voltage of the device while holding the drain and source voltage constant will have a given effect on the body voltage.

Considering all of the switching types possible will give a range of possible voltage changes around the static body voltage. Depending on the type of simulation desired, we can then either pick one of these voltages at random to vary the static voltage with, to represent a device with an unknown switching history, or we can pick a value corresponding to a known switching history, or we can select the value giving the best or worst case delay.

As we can reset the body voltage at any time we desire, we can solve the problem of successive delays in one simulation run by resetting the voltage before each delay measurement starts.

To solve the problem of predicting the delay in a delay predictor (for example, delay rules generation), we can include the offset from the body voltage as a part of the best case/worst case determination. For example, to find the fastest delay of a circuit, in addition to selecting the fastest process and environment variables, select the body voltage that gives the fastest delay. This can be done automatically with a distribution in IBM's AS/X (described below), for example.

This methodology has been implemented in IBM's AS/X system or other circuit simulators like SPICE for use in a model for SOI simulation, and can be used by any designer using SOI based FET logic. These methods can be encoded into standard electronic design software, and they typically will be described in their documentation.

Now we must appreciate that in actuality the voltage is not random. In our improvement described herein below with respect to FIG. 2, as compared to FIG. 1, we will describe in FIG. 2, the circuit shown in the drawing and described below. It is a part of a standard latch circuit which is widely used in our circuitry.

Figure 2:
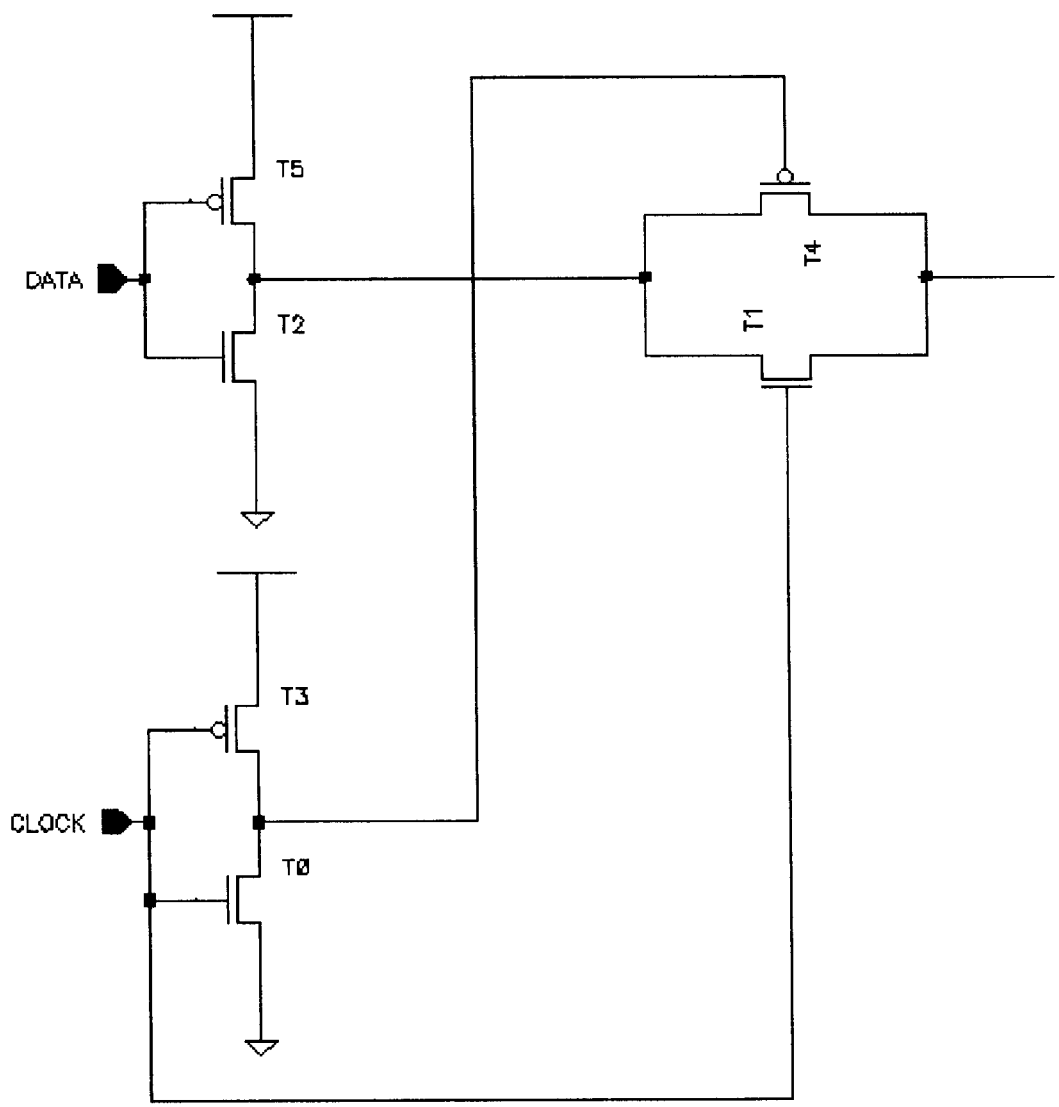
FIG. 2 illustrates the improvement made to the disclosure of FIG. 1.

From FIG. 2, it can be readily seen that the path of interest is from either of the two inputs to the right side of the circuit. If a slow history is assumed for all transistors, it is obvious that the delay of the path will be slow, and similarly for a fast history, the delay will be fast. In this circuit, however, delay is not the only item of interest. We are also interested in the relative time of arrival of the signals from the "CLOCK" and "DATA" inputs. This is used, for example, in the setup time computation of a latch.

In most systems, the clock running for long periods of time, in a repetitive manner. Therefore, one can quickly see that transistors T0 and T3, for example, must be in their AC steady state body voltage condition.

The data input, however, is unpredictable. Its value will depend on the exact computations being performed in this circuit. Therefore, it is necessary to assume that the data pattern could be such as to have a slow history in transistors like T2 and T5. Alternatively, there could be a fast history for these transistors, or any other possible history between these values.

We can thus classify all the transistors by a simple topological analysis into categories based on their terminal signals. Here, we can say that T0 and T3 are "clock" transistors. This is because that their gates are connected to a clock signal, while their drains and sources are tied to power supplies.

Similarly, we classify T2 and T5 as "data" transistors. This is because their gates are connected to a data signal, while their drains and sources are tied to power supplies.

This leaves transistor T1 and T4. We call these "mixed" transistors, as their gates depend on the clock and the sources and drains have data like characteristics. A different type of "mixed" transistor, though not commonly seen, has a data signal on the gate and a clock signal on the drains.

Therefore, we have modified the transistor models disclosed previously to allow explicit specification of the type of history. We implement this as a range from slow values to fast values. The topological analysis described above tells us to which category a transistor belongs. "Clock" transistors, for example, would be assigned to the equilibrium values only case. We can do this since the gate voltage is always switching. "Data" transistors, on the other hand, must be allowed to assume the full range of body voltage values as nothing is known of the history.

A simplification that can be done is to combine the "Clock" and "Mixed" set of transistors. Based on our simulations, this yields little inaccuracy and permits simplification of the topology analysis. This step is optional, and all 4 types of transistors can be kept for a detailed analysis.

Our method can be implemented as a set of AS/X models for use in delay rules generation for standard library usage.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for use in a model for simulation of an SOI device including an SOI circuit, comprising the steps of:

setting the floating body voltage to any desired value at any time during the simulation by analyzing what part of a circuit might be in AC equilibrium and adding to the model an ideal voltage source, whose value is a desired body voltage, in series with an ideal current source, whose value is a constant times the voltage across itself.

2. A method for use in a model according to claim 1 wherein when the constant is zero, no current can flow, and any additional components have no effect on the circuit.

3. A method for use in a model according to claim 2 wherein when the constant is non-zero, said ideal current source appears to be the same as a resistor such that current can flow in to or out from the body node, setting its voltage.

4. A method for use in a model according to claim 3 wherein said constant is kept zero at all times, except when it is desired to change the body voltage.

5. A method for use in a model according to claim 4 wherein for use in selecting a value for the ideal voltage source which will set the desired floating body voltage, wherein a first, a static body voltage is computed solely by considering the terminal voltages of the device and the temperature and in which step said static body voltage is the voltage the body will naturally settle at after a long time with no switching activity.

6. A method for use in a model according to claim 5 wherein from said base static voltage, limits on the changes to this voltage are found based on the different types of switching activity possible.

7. A method for use in a model according to claim 6 wherein limits on the changes to said static body voltage are found by increasing the gate voltage of the device while holding the drain and source voltage constant will have a given effect on the body voltage.

8. A method for use in a model according to claim 6 wherein different switching types are considered and after considering all of the switching types a range of possible voltage changes around the static body voltage is provided.

9. A method for use in a model according to claim 5 including a step of providing an offset from the body voltage as a part of the best case/worst case determination.

10. A method for use in a model according to claim 5 including a step of resetting said body voltage at any time desired in a simulation by resetting the voltage before each delay measurement starts.

11. A method according to claim 1 wherein said method is encoded into design software for use in SOI based FET logic design.

12. A method according to claim 1 wherein while setting the floating body voltage to any desired value at any time during the simulation by analyzing what part of a circuit might be in AC equilibrium, performing a topological analysis of the device by determining a category into which an analyzed circuit element belongs based upon examination of a circuit element's terminal signals.

13. A method according to claim 12 wherein said topological analysis is for a gate element, and in the analysis a determination is made whether said gate element is connected to a periodic signal.

14. A method according to claim 13 wherein if the gate element is determined to be repetitively switching during the topological analysis, the gate is determined to be in AC equilibrium.

15. A method according to claim 12 wherein said topological analysis is for a drain element, and in the analysis a determination is made whether said drain element is connected to a periodic signal.

16. A method according to claim 15 wherein if the drain element is determined to be periodically switching during the topological analysis, the drain element is determined to be in AC equilibrium.

17. A method according to claim 12 wherein said topological analysis includes testing a plurality of circuit elements, and in the analysis a determination is made whether said elements are connected to a periodic signal, and if neither is determined to be connected to a periodic signal no assumption is made as to a category into which an analyzed circuit element belongs.

18. A method according to claim 12 wherein said topological analysis includes testing an analyzed circuit which includes a plurality of circuit elements, and in the analysis a determination is made whether said elements are connected to a periodic signal, and if one of said elements is connected to a periodic signal and the other is not connected to a periodic signal, a determination is made that the analyzed circuit belongs in a category for mixed category circuit elements.

* * * * *